United States Patent
Nagasaka

Patent Number: 5,500,278
Date of Patent: Mar. 19, 1996

[54] MULTILAYER SUBSTRATE

[75] Inventor: Takashi Nagasaka, Anjo, Japan

[73] Assignee: Nippondenso Co., Ltd., Kariya, Japan

[21] Appl. No.: 188,322

[22] Filed: Jan. 28, 1994

Related U.S. Application Data

[63] Continuation-in-part of Ser. No. 914,627, Jul. 17, 1992, abandoned.

[30] Foreign Application Priority Data

Jul. 17, 1991 [JP] Japan .................................. 3-177010

[51] Int. Cl.$^6$ .................................................. B32B 9/00
[52] U.S. Cl. ............................................ 428/210; 428/901
[58] Field of Search ................................. 428/209, 210, 428/901

[56] References Cited

U.S. PATENT DOCUMENTS

| | | | |
|---|---|---|---|
| 4,663,215 | 5/1987 | Dubuisson et al. | 428/209 |
| 4,732,798 | 3/1988 | Ishida et al. | 428/137 |
| 4,795,670 | 1/1989 | Nishigaki et al. | 428/209 |
| 5,063,121 | 11/1991 | Sato et al. | 428/210 |
| 5,093,186 | 3/1992 | Kimura et al. | 428/209 |
| 5,156,903 | 10/1992 | Okumura et al. | 428/209 |
| 5,232,765 | 8/1993 | Yano et al. | 428/195 |

FOREIGN PATENT DOCUMENTS 1298796 12/1989 Japan .
5021635 1/1993 Japan .

OTHER PUBLICATIONS

Journal of Nippondenso Technical Disclosure "Layered Ceramic Substrate", Mar. 1987, No. 52.

Primary Examiner—Patrick J. Ryan
Assistant Examiner—Kam F. Lee
Attorney, Agent, or Firm—Cushman, Darby & Cushman

[57] ABSTRACT

This invention provides a multilayer substrate suited for hybrid ICs.

The multilayer substrate is formed from a plurality of layered insulating layers, at least one of which is provided with an inner-layer wiring space extending in the planer direction of the insulating layers and filled with a conductive wiring material. The inner-layer wiring space, which can be in the form of a strip, is connected via through holes to flip chip ICs, resistors, etc., so as to form a circuit.

The inner-layer wiring composed of a wiring space extending in the planer direction and filled with a conductive wiring material has a larger cross-sectional area for the passage of electric current and is lower in electrical resistivity, in comparison with conventional wiring formed by printing.

31 Claims, 9 Drawing Sheets

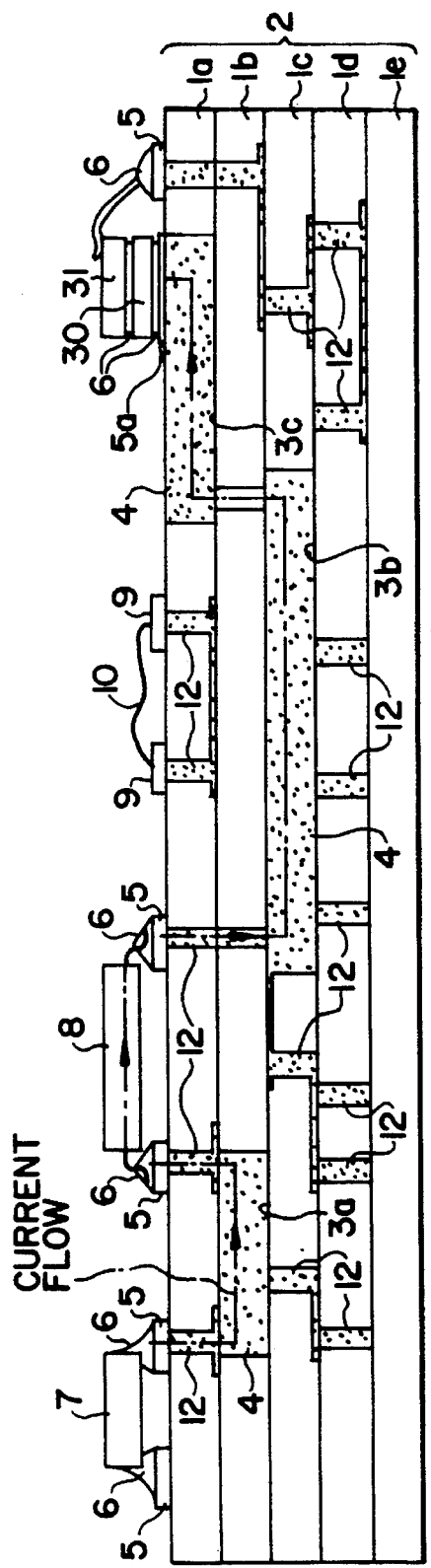
FIG. 19
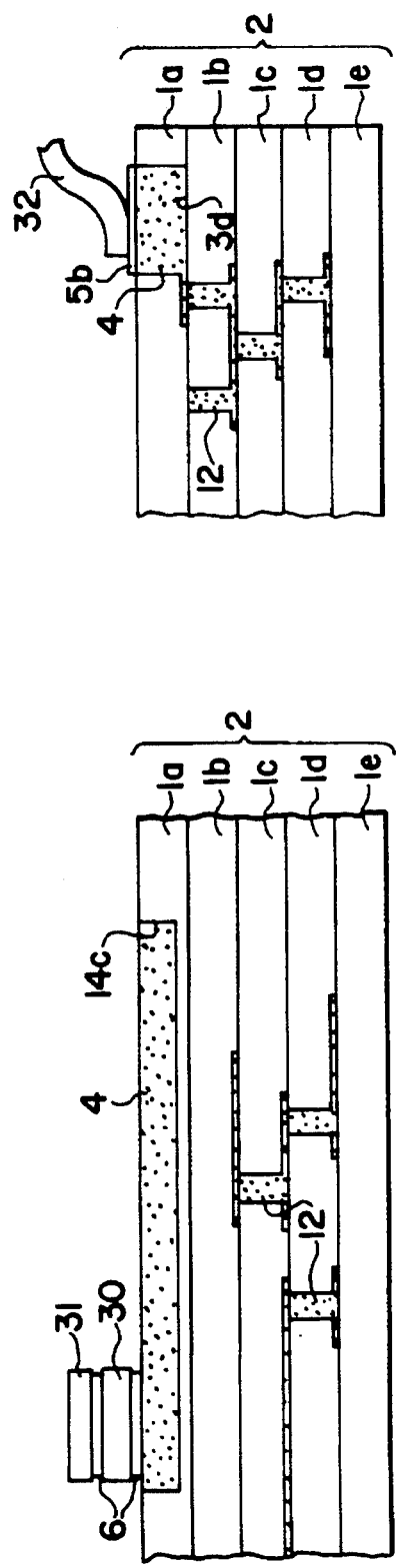
FIG. 21
FIG. 20

5,500,278

MULTILAYER SUBSTRATE

CROSS REFERENCE TO RELATED APPLICATION

This application is a continuation-in-part of U.S. patent application Ser. No. 914,627, filed on Jul. 17, 1992, now abandoned.

BACKGROUND OF THE INVENTION

1. Field of the Invention

The present invention relates to a multilayer substrate to be used for a hybrid integrated circuit.

2. Description of Related Art

Heretofore, layered green sheet substrates have been produced by (i) printing on green sheets a circuit wiring pattern, (ii) laminating a plurality of printed green sheets and then (iii) sintering the laminated product. For green sheet substrates, layered alumina substrates have been produced by (i) printing on alumina green sheets a circuit wiring pattern of a material composed of a refractory metal, such as tungsten (W) and molybdenum (Mo), (ii) laminating a plurality of printed green sheets and then (iii) sintering the laminated product in a reducing atmosphere (e.g., a mixture of H2 and N2 gases) at around 1,600° C.

Layered glass ceramic substrates have been produced by (i) printing on glass ceramic green sheets a circuit wiring pattern of a material consisting mainly of silver (Ag) or copper (Cu), (ii) laminating a plurality of printed green sheets and then (iii) sintering the layered product in air or in a nitrogen atmosphere at around 800° C. to 1,000° C.

However, the electrical resistivity of tungsten and molybdenum used as the wiring material in the layered alumina substrates is as high as 5.5 $\mu\Omega$.cm or 5.7 $\mu\Omega$.cm, respectively, or three times greater than that of Ag (1.6) or Cu (1.67), conductive materials conventionally used in other layered substrates. Because of this, layered alumina substrates are not usable for applications in fields where the electrical resistivity of wiring must be small. The resistivity of wiring in glass ceramic substrates can be relatively low because of the use of low resistance wiring materials. The substrates, however, are still unsatisfactory when used in applications in the field of, e.g., communications or computers. It has therefore been desired to further lower the resistivity of their wiring.

SUMMARY OF THE INVENTION

It is an object of the present invention to provide a multilayer substrate provided with wiring having a lowered electrical resistivity.

The present invention is concerned with a multilayer substrate comprising a plurality of insulating layers, at least one of which is provided with one or more wiring spaces formed at places corresponding to wiring patterns extending in the planner direction thereof, the wiring spaces being filled with a conductive wiring material.

The wiring in the planer direction of the multilayer substrate according to the invention is in the form of an intra-layer wiring based on a wiring space filled with a conductive wiring material. Because of this, the cross-sectional area of the wiring can be greater than in prior wiring formed by printing and present between layers and hence, electric current can flow with a lowered resistivity because of the enlarged cross-sectional area of its passage.

In addition, the wiring space formed in an insulating layer makes it possible to eliminate or absorb the undesired unevenness on the surface of the substrate that might be caused by a thick wiring pattern formed by means of printing in the planer direction, as well as the undesired stress that might be generated by such a thickly printed wiring pattern.

Thus, the present invention provides a lower resistivity of wiring formed in multilayer substrates.

BRIEF DESCRIPTION OF THE DRAWINGS

FIGS. 2 to 5 are schematic views illustrating steps for producing a substrate according to the first example, wherein FIGS. 2 to 4 are partial perspective views and FIG. 5 is a schematic view illustrating a punching step using a press;

FIGS. 7 to 10 are schematic views illustrating steps for producing a substrate according to the second example, wherein FIGS. 7 to 9 are partial perspective views of a substrate and FIG. 10 is a schematic view showing a pressing step using a press;

FIGS. 12 to 15 are schematic views illustrating steps for producing a substrate according to the third example of the invention, wherein FIGS. 12 to 14 are partial perspective views of a substrate and FIG. 15 is a view showing a punching step using a press;

FIG. 19 is a cross-sectional view of a hybrid IC according to a fourth example of the invention; and FIG. 20 and 21 are cross-sectional views of substrates showing modifications of the fourth examples.

DETAILED DESCRIPTION OF THE EMBODIMENTS

The present invention will be explained with reference to the drawings showing embodiments of the invention.

The explanation of the following examples will be based on layered alumina substrates.

EXAMPLE 1

Figure 1:
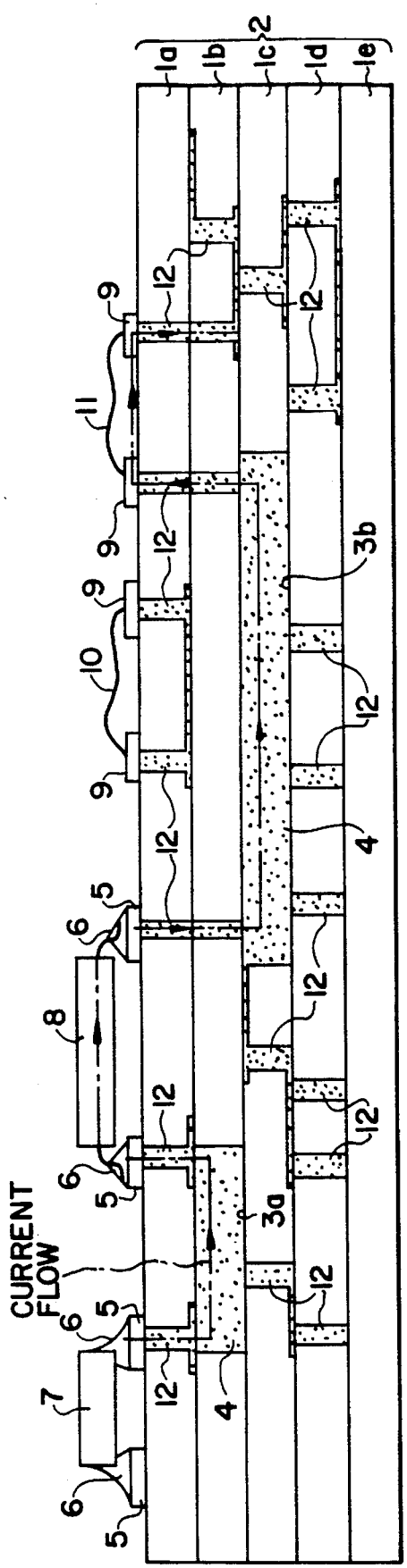
FIG. 1 is a cross-sectional view of a hybrid IC according to a first example of the invention.

In FIG. 1 is shown a cross-sectional view of a hybrid IC. In the hybrid IC, five alumina insulating layers, 1a, 1b, 1c, 1d and 1e, are laminated to form a multilayer substrate 2. The insulating layer 1b of the multilayer substrate 2 has a full-depth trench (an inner-layer wiring space) 3a for the purpose of inner-layer wiring, and the trench 3a is filled with a conductive wiring material 4. Similarly, in the insulating layer 1c of the multilayer substrate 2 is formed a full-depth trench (inner-layer wiring space) 3b, and the trench is also filled with a conductive wiring material. The inner-layer wiring trenches 3a and 3b are in the form of a strip. Chips 7 and 8 are mounted, via surface conductors 5 and solder 6, above the upper surface of the multilayer substrate 2. Printed resisters 10 and 11 are also formed via surface conductors 9.

In FIG. 1, numeral 12 denotes a through hole wiring (interlayer wiring).

Referencing now FIGS. 2, 3 and 4, explanation will be given on the production of the multilayer substrate 2.

Figure 2:
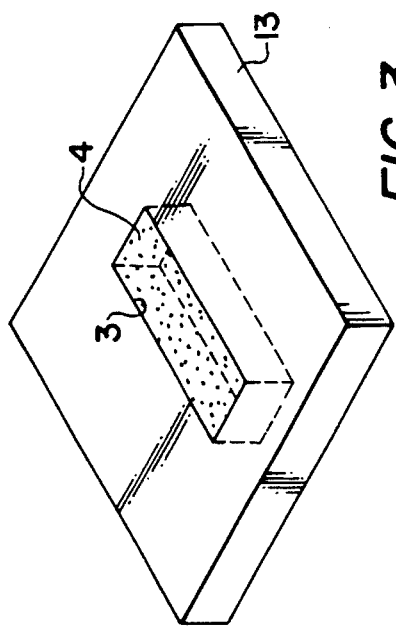
Figure 5:
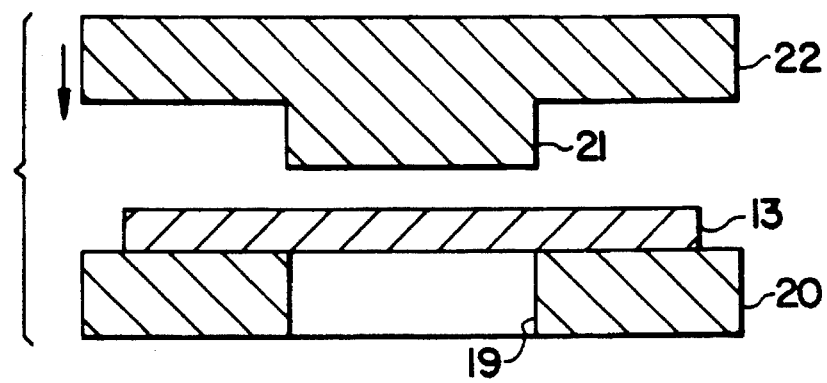

As is shown in FIG. 2, a planer alumina green sheet 13 is prepared, and a full depth inner-layer wiring trench 3 is formed in the green sheet 13. The trench is formed by means of punching using a press. To be more specific, a movable member 22 having a projection 21 is positioned against a stationary member 20 having a hole, as is shown in FIG. 5. An alumina green sheet 13 is placed on the stationary member, and the movable member is moved downward to form a full-depth inner-layer wiring trench 3.

Figure 3:
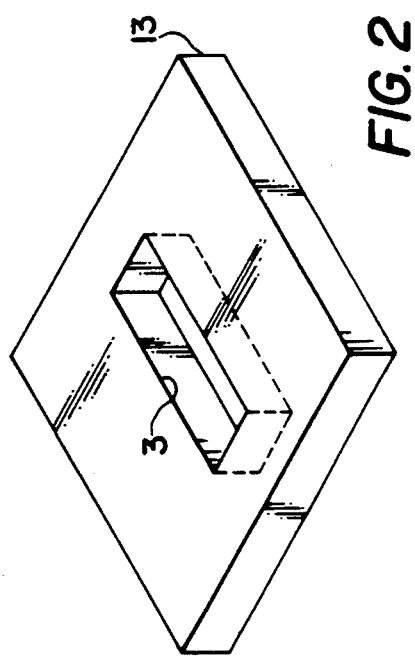

As shown in FIG. 3, the inner-layer wiring trench 3 is then filled with a conductive inner-layer wiring material 4, by means of press-fitting or screen printing. As the wiring material 4, tungsten (W) added with from 0.1% to 30% of $Al_2O_3$ can be used. By the addition of $Al_2O_3$, a material identical with the alumina substrate, the coefficient of thermal expansion of tungsten can be balanced with that of alumina and, at the same time, the adhesion between the alumina substrate and the wiring material can be strengthened. When $Al_2O_3$ is added in an amount greater than 30%, an undesirably high resistivity of the wiring material may result, whereas when the amount is less than 0.1%, there may be resulted an insufficient adhesion strength between the wiring material and the alumina substrate.

Figure 4:
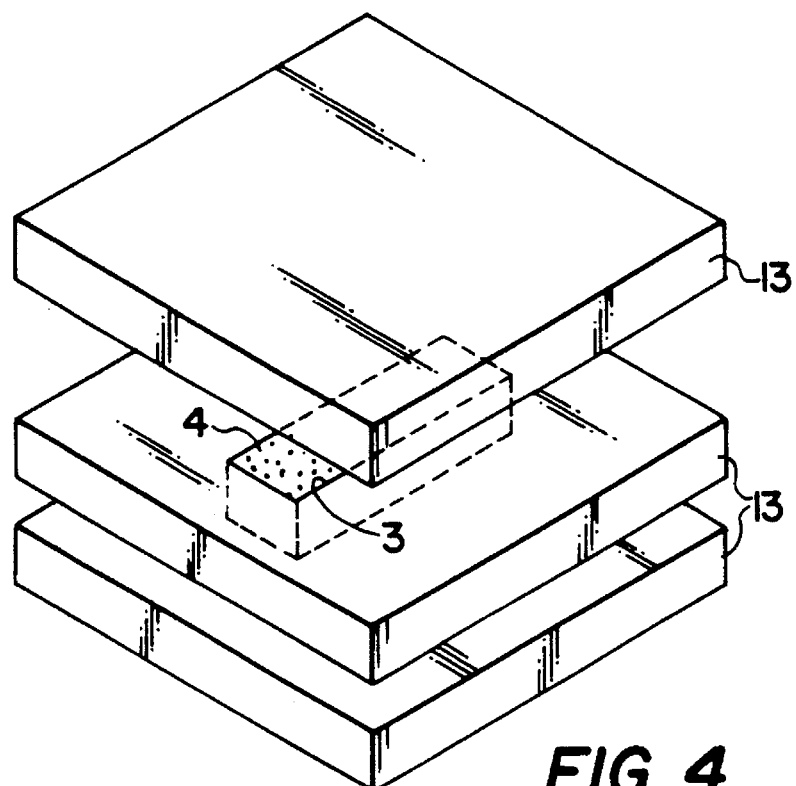

If necessary, a conventional wiring can be formed in accordance with the prior printing technique, and then the alumina green sheets, 13, 13 . . . are laminated as shown in FIG. 4. In the lamination step, alumina green sheets 13, 13 . . . are layered and press-formed with heating. Subsequently, the laminated product is subjected to sintering, and the sintered product is provided with flip chip ICs, resistors, etc., to produce a hybrid IC as shown in FIG. 1.

Although not shown in FIGS. 2 to 4, through holes, 12, 12 . . . are also formed in alumina green sheets 13, 13 . . . at places required, prior to the printing of the conventional wiring. The through hole wirings 12, 12 . . . can be formed by (i) making through holes by means of pressing or punching before, after or at the time when the full-length trench 3 is formed, and (ii) filling a paste of conductive material into the holes, e.g., by means of screen printing, at the time when the conductive inner-layer wiring material 4 is filled.

In this example, full-depth inner-layer wiring trenches (inner-layer wiring spaces) 3a and 3b are formed in the insulating layers 1b and 1c of the multilayer substrate 2, and the trenches 3a and 3b are filled with a conductive wiring material 4. In other words, an inner-layer wiring is formed consisting of a conductive material 4 filled in the full-depth trenches 3a and 3b formed in the layers 1b and 1c. Because of this, the electric resistivity of the wiring is smaller due to an increase in the cross-sectional area of the passage of electric current, in comparison with the prior wiring formed between layers by means of printing.

Figure 16:
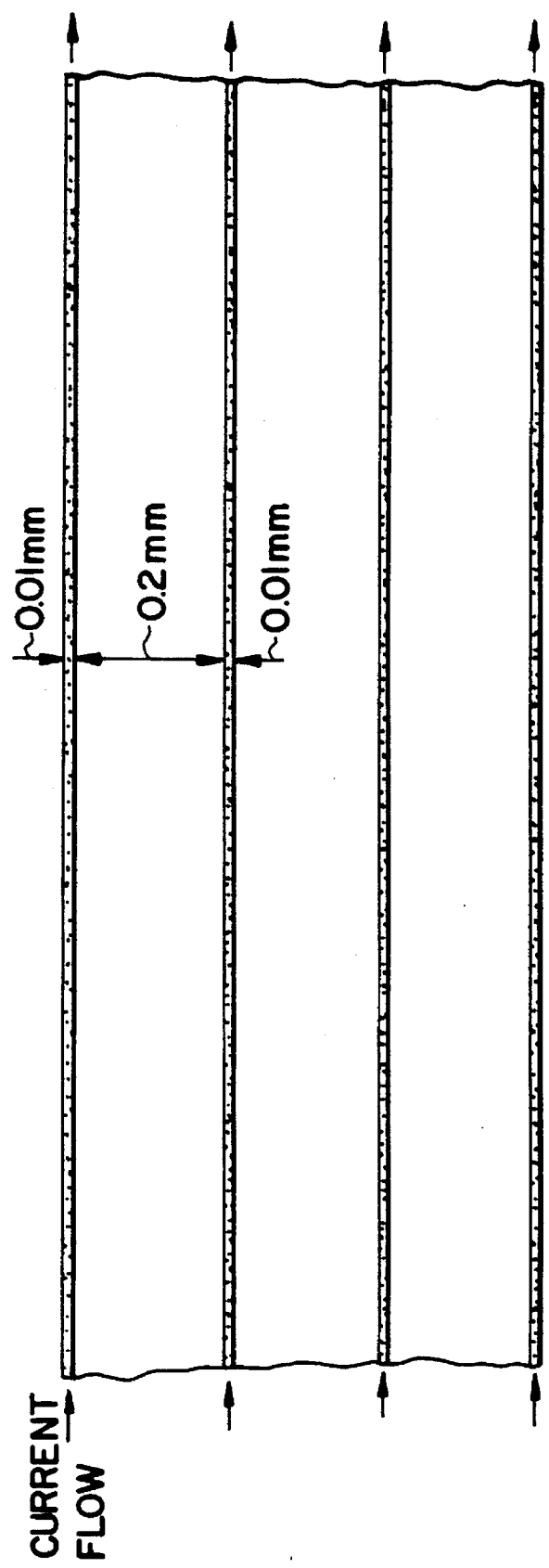
FIG. 16 is a cross-sectional view of a substrate having wiring patterns formed by the prior printing technique.

In general, the thickness of wiring formed by printing between insulating layers in a layered substrate is in the range of about 10 μm to 15 μm, and such a wiring has a sheet resistivity of about 10 mΩ/□ to 15 mΩ/□. See FIG. 16 In the present invention, the wiring can be as thick as the alumina green sheet 13, that is, the thickness of the wiring can be 10 to 40 times that of a wiring formed by printing. Thus, the sheet resistivity of the wiring can be as small as 1 mΩ/□ to 0.2 mΩ/□.

In this example, in addition to the lowering in resistivity owing to the inner-layer trenches, the resistivity of the wiring material can be lowered by adding into tungsten (W) a low-resistant metal having a melting point not higher than 1,600° C. (for example, Ag, Au, Cu, Ni or Pd) in an amount of from 0 to about 30%. Such a low-resistivity metal is added preferably in an amount up to about 30%, so that it can be molten to fill the gaps of W grains without flowing.

EXAMPLE 2

Explanation will be given only on the difference between Example 2 and Example 1.

Figure 6:
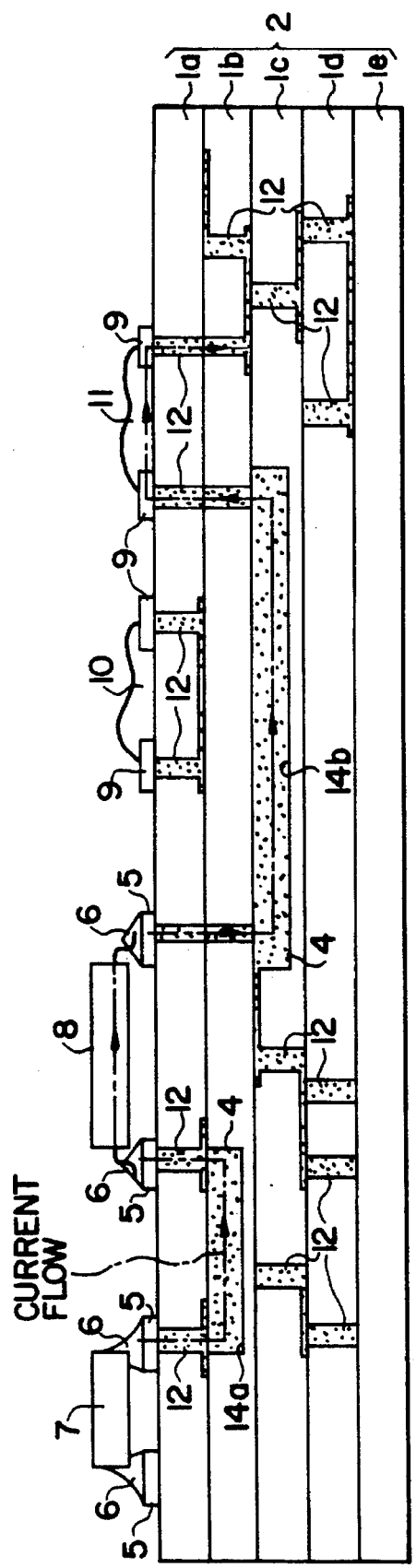
FIG. 6 is a sectional view of a hybrid IC according to a second example of the invention

As is shown in FIG. 6, an inner-layer wiring trench (inner-layer wiring space) 14a is filled with a conductive wiring material 4 and is formed in an insulating layer 1b of a multilayer substrate 2. Similarly, an inner-layer wiring trench (inner-layer wiring space) 14b is filled with a conductive wiring material 4 and is formed in an insulating layer 1c of the multilayer substrate 2. The inner-layer wiring trenches 14a and 14b are in the form of a strip.

Figure 8:
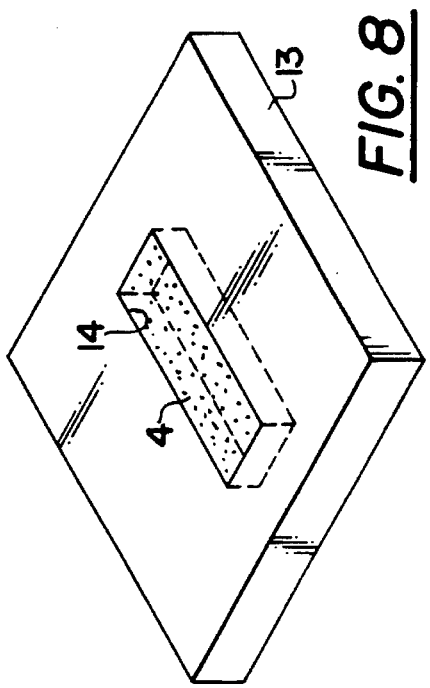
Figure 7:
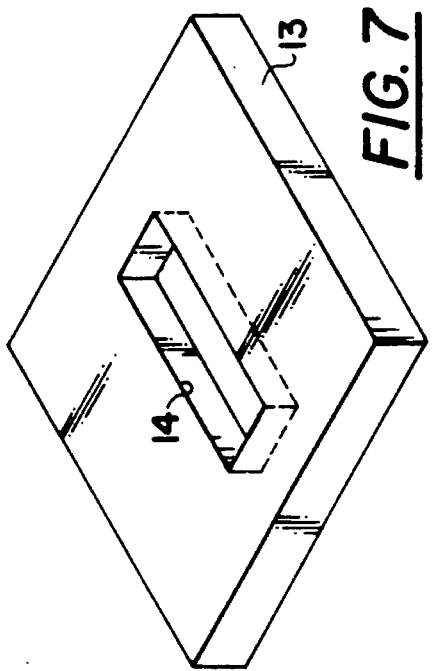
Figure 9:
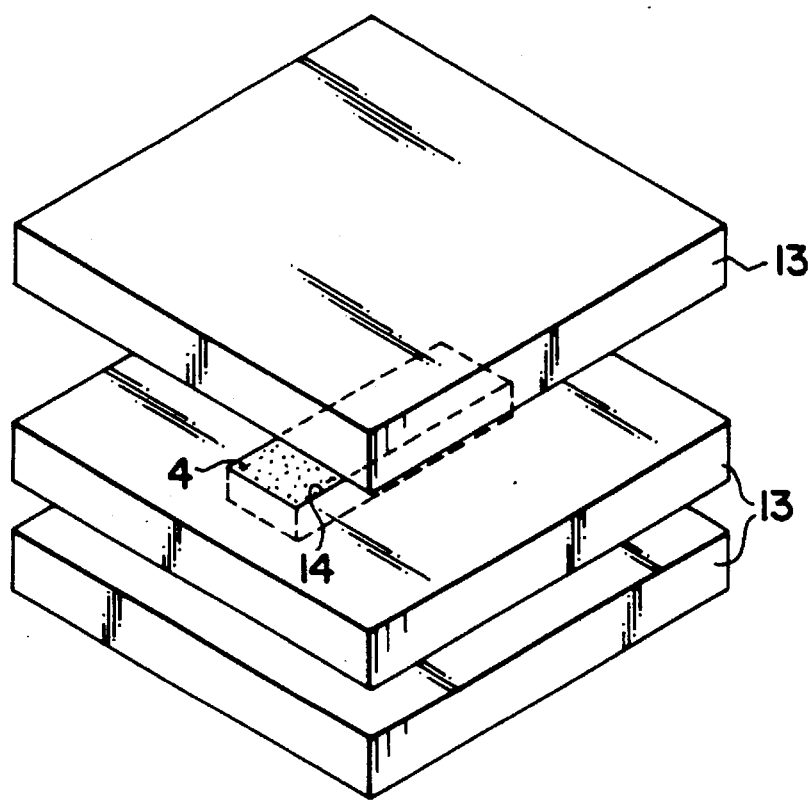

Referring now to FIGS. 7, 8 and 9, explanation will be given on the production of the multilayer substrate 2.

Figure 10:
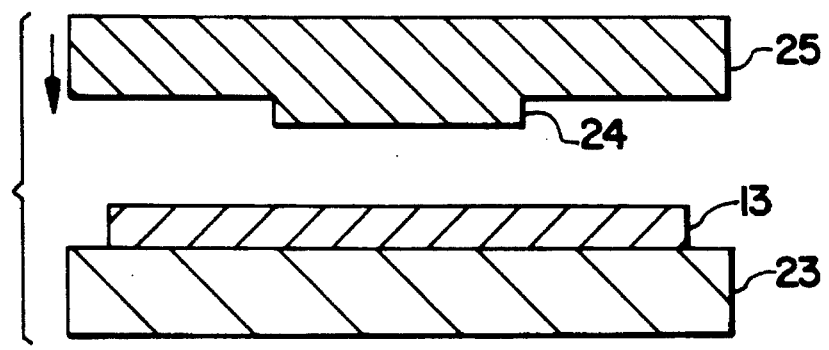

As is shown in FIG. 7, a planner alumina green sheet 13 is prepared, and an inner-layer wiring trench 14 is formed in the alumina green sheet 13. The trench is formed by means of pressing using a press. To be more specific, a movable member 25 having a projection 24, is positioned against a stationary member 23, as is shown in FIG. 10. An alumina green sheet 13 is placed on the stationary member, and the movable member 25 is moved downward to form an inner-layer wiring trench 14. As in Example 1, through holes are formed in the alumina green sheet, at places required, by means of pressing or punching.

As shown in FIG. 8, the inner-layer wiring trench 14 is filled with a conductive wiring material 4 by means of press-fitting or screen printing. At the same time, the wiring material is filled into through holes to form through hole wiring 12. If necessary, a conventional wiring can be formed in accordance with the prior printing technique, and the alumina green sheets 13, 13 . . . are laminated, as is shown in FIG. 9. The laminated green sheets are then integrated by means of sintering, to produce a hybrid IC, as is shown in FIG. 6.

In this example, inner-layer wiring trenches (inner-layer wiring spaces) 14a and 14b are formed in the insulating layers 1b and 1c of the multilayer substrate 2, and the trenches 14a and 14b are filled with a conductive wiring material 4. In other words, an inner-layer wiring is formed consisting of a conductive material 4 filled in the trenches 14a and 14b formed in the insulating layers 1b and 1c. Because of this, the resistivity of the wiring is smaller due to an increase in the cross-sectional area of the passage of electric current, in comparison with the prior wiring formed between layers by means of printing.

EXAMPLE 3

Explanation will be given only on difference between Example 3 and Example 1.

Figure 11:
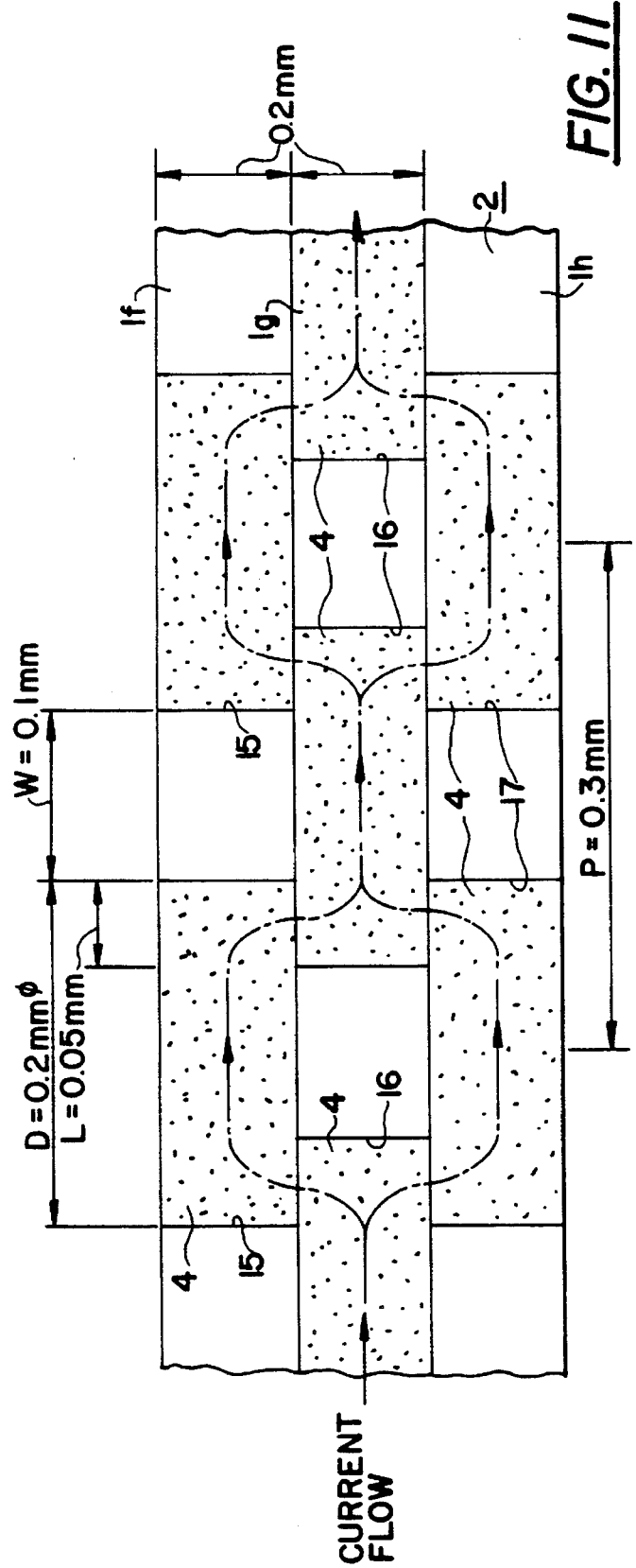
FIG. 11 is a cross-sectional view of a substrate of a hybrid IC according to a third example of the invention.

As is shown in FIG. 11, a large number of full-depth inner-layer wiring trenches (inner-layer wiring spaces) 15, 16 and 17 are formed in insulating layers 1f, 1g and 1h of the multilayer substrate 2, and the inner-layer wiring trenches 15, 16 and 17 are filled with a conductive inner-layer wiring material 4. The inner-layer wiring trenches 15, 16 and 17 are in the form of a cylinder. The inner-layer wiring holes 15, 16 and 17 have a diameter (D) of 0.2 mm, and the pitch of the trenches 15, 16 and 17 is 0.3 mm (=1.5D). Accordingly, the overlap (L) among the full-depth inner-layer trenches 15, 16 and 17 formed in the insulating layers 1f, 1g and 1h is 0.05 mm (=0.25D).

Figure 13:
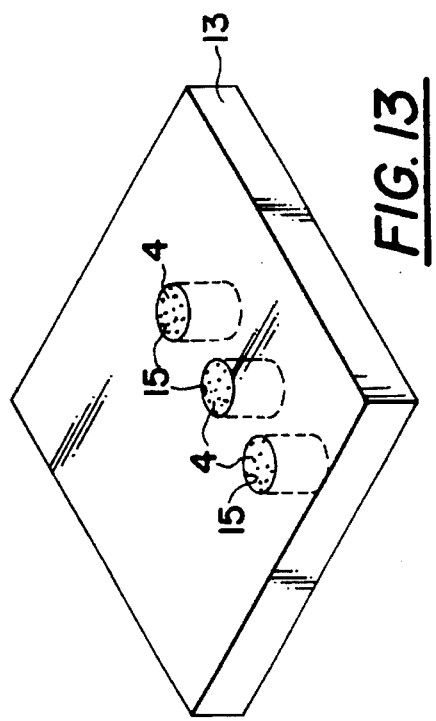
Figure 12:
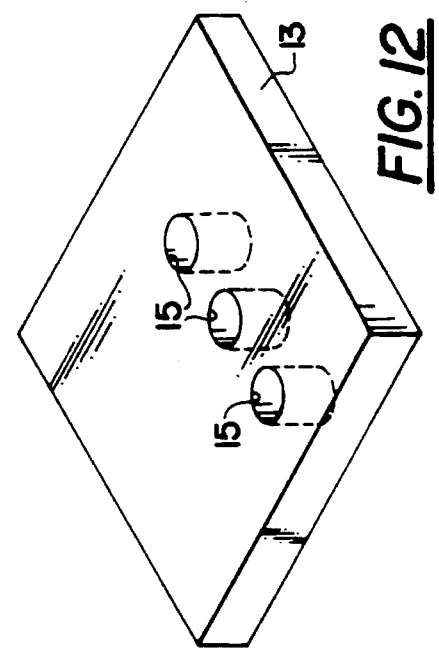
Figure 14:
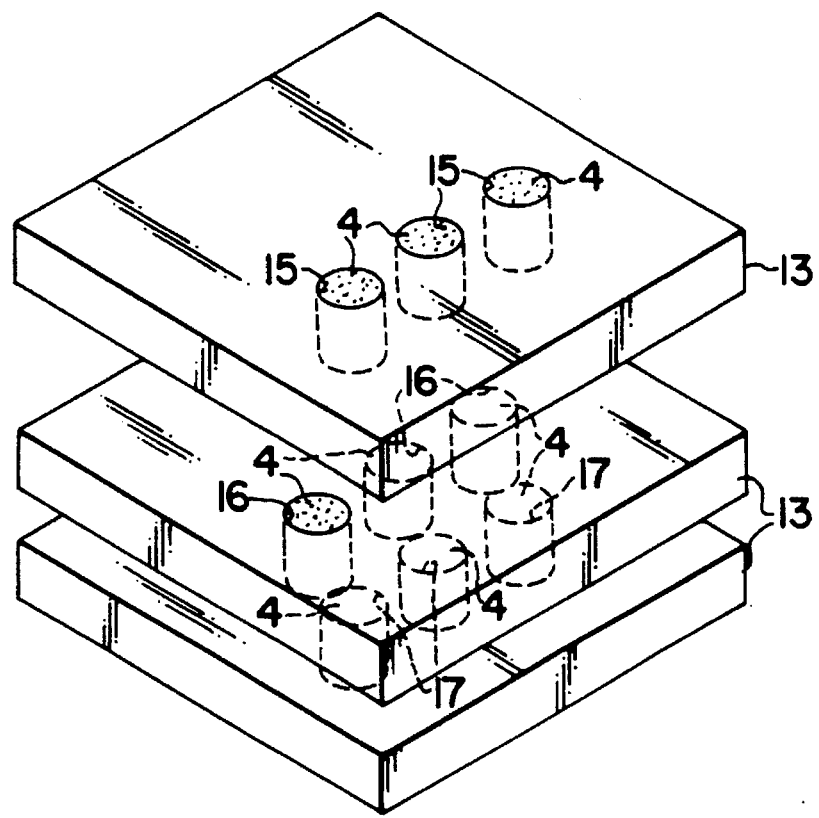

Referring now to FIGS. 12, 13 and 14, explanation will be given on the production of the multilayer substrate 2.

Figure 15:
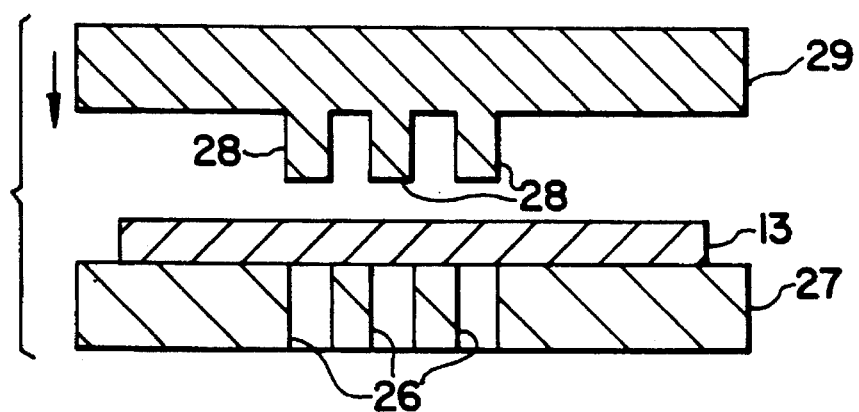

As is shown in FIG. 12, planer alumina green sheets 13, 13 . . . are prepared, and full-depth inner-layer trenches 15, 16 and 17 are formed in the alumina green sheets. The trenches can be formed by means of punching using a press. To be more specific, a movable member 29 having a cylindrical projections 28 . . . are positioned against a stationary member 27 having holes, as is shown in FIG. 15. An alumina green sheet 13 is placed on the stationary member 27, and the movable member 29 is moved 1 downward to form inner-layer wiring trenches 15, 16 and 17.

As is shown in FIG. 13, the trenches 15, 16 and 17 are filled with a conductive wiring material 4, by means of press-fitting or screen printing. After a conventional wiring has been formed by means of printing, the alumina green sheets 15, 16 and 17 are laminated in such a manner that the full-depth trenches 15, 16 and 17 are partly overlapped as is shown in FIG. 14. Thereafter, the laminated product is sintered to produce a multilayer substrate for hybrid ICs, as is shown in FIG. 11.

In this example, full-depth inner-layer wiring trenches (inner-layer wiring spaces) 15, 16 and 17 are formed in the insulating layers 1f, 1g and 1h of the multilayer substrate 2, and the trenches are filled with a conductive wiring material 4. In other words, an inner-layer wiring is formed consisting of a conductive material 4 filled in the trenches 15, 16 and 17 formed in the insulating layers 1f, 1g and 1h. Because of this, the resistivity of the wiring is smaller due to an increase in the cross-sectional area of the passage of electric current, in comparison with the prior wiring formed between layers by means of printing.

In this case, the full-depth inner-layer wiring trenches 15, 16 and 17 are positioned in such a manner that the trenches formed in the adjacent insulating layers 1f, 1g and 1h are overlapped by 0.05 mm, as is shown in FIG. 11. As a result, the passage of electrical current has a width of at least 0.05 mm in the planer direction. Thus, the area of the passage of electric current becomes greater, compared with the thickness of about 0.01 mm of the prior wiring formed by printing, and a lowering in the resistivity of the wiring results.

Figure 17:
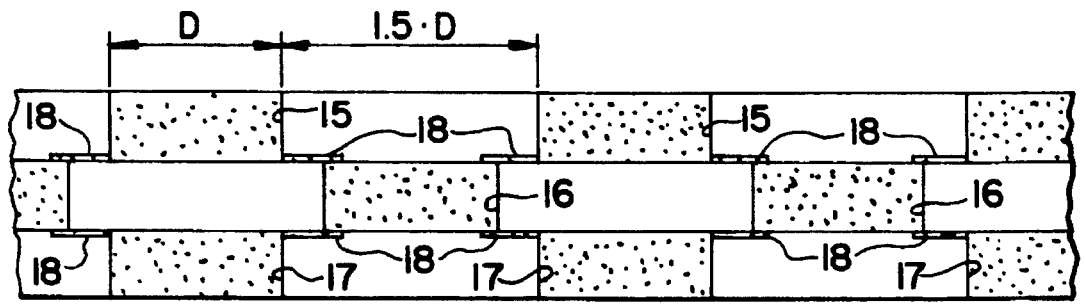
FIGS. 17 and 18 are cross-sectional views of substrates showing modifications of the third examples.
Figure 18:
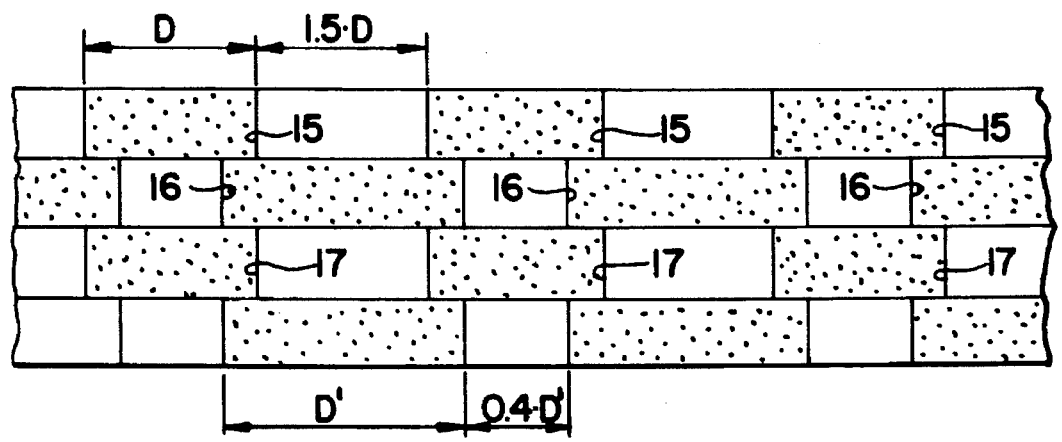

In a modification of this example, the pitch of the full-depth inner-layer trenches 15, 16 and 17 can be made greater, as is shown in FIG. 17. In this case, the trenches 16, 17 and 18 formed in adjacent insulating layers are connected by a conductive wiring material 18 formed by printing. It is also possible to utilize a combination of fulldepth intra-layer wiring trenches 15, 16 and 18 having different diameters, as is shown in FIG. 18.

EXAMPLE 4

Explanation will be given only on the difference between Example 4 and Example 1.

As shown in FIG. 19, an inner-layer wiring trench (inner-layer wiring space) 3c filled with a conductive wiring material 4 is formed in an insulating layer 1a which is a top end layer of a multilayer substrate 2. The inner-layer wiring trench 3c is in the form of a strip. The top surface of the conductive wiring material 4 in the inner-layer wiring trench 3c has the same height as the insulating layer 1a, but it is allowable that the surface of the conductive material 4 is higher or lower than that of the insulating layer 1a. A power semiconductor chip 31 is mounted, via solder 6 and a heat sink member 30, above the upper surface of the conductive wiring material 4 in the insulating layer 1a, whereby the chip 31 is electrically connected with the conductive material 4.

As shown in FIG. 19, the use of a plated layer 5a of Ni, Cu, Au, etc., can be advantageous for improving the solder wettability, in cases where the conductive wiring material 4 is produced from Mo or W. The plated layer 5a is formed at least at the region which the chip 31 is mounted, but a much wider forming area, e.g. the whole upper surface of the conductive wiring material 4, is obviously allowable.

In this example, a full-depth inner-layer wiring trench 3c is formed in the top end insulating layer 1a of the multilayer substrate 2, and the trench 3c is filled with the conductive wiring material 4. Because of this, the electric resistivity of the wiring can be smaller due to increase in the cross sectional area of the passage of electric current which is supplied to the chip 31. In addition to the lowering in resistivity, the thermal conductivity from the power semi-conductor chip 31 can be improved by the conductive wiring material 4 which is acting as heat sink.

It is also possible to use a half-depressed inner-layer wiring trench 14c, as shown in FIG. 20. This case can obtain the same effect.

In a modification of this example, the conductive material 4 disposed in the upper end insulating layer 1a can be bonded to a lead wire 32 directly by welding, as shown in FIG. 21. In this case, a welding pad can be superseded. In FIG. 21, numeral 5b denotes a surface treated layer of the conductive material 4.

It should be understood that the invention is not limited to the embodiments shown in the above examples. For example, inner-layer wiring spaces can be formed at the time when planer green sheets are formed. In this case, a mold provided with one or more projections can be used for forming inner-layer wiring spaces.

It is also possible to use a substrate produced from glass green sheets (glass ceramic green sheets), instead of ceramic green sheers used in the above examples. The present invention can also be applied to a substrate having insulating layers formed by printing, including those having thick insulating layers formed from a glass or ceramic paste.

With regard to wiring material, the use of W and/or Mo can be advantageous in cases where the substrate is produced from a ceramic, such as alumina or the like. In cases where a glass ceramic is used for the substrate, the use of Ag, Ag/Pd, Cu, etc., can be advantageous.

What is claimed is:

1. A multilayer substrate comprising:
    a plurality of insulating layers having a plurality of through holes which form vertical current paths, one of said plurality of insulating layers having a trench therein extending in a lateral direction of said multilayer substrate; and
    wiring material, formed by a conductive material filled in said trench, for providing a lateral current path to electrically connect a first one of said plurality of through holes with a second one of said plurality of through holes.

2. A multilayer substrate as claimed in claim 1, wherein said wiring material further includes an insulating material being a same insulating material as an insulating material which forms said plurality of insulating layers.

3. A multilayer substrate as claimed in claim 1, wherein a depth of said trench is equal to a thickness of said one of said plurality of insulating layers.

4. A multilayer substrate comprising:

a first insulating layer comprising first and second through holes which form vertical current paths;

a second insulating layer formed on one surface of said first insulating layer and having a trench therein extending in a lateral direction of said multilayer substrate; and wiring material, formed by a conductive material filled into said trench, for electrically connecting said first through hole to said second through hole.

5. A multilayer substrate as claimed in claim 4, wherein said first and second through holes of said first insulating layer are disposed so as to connect respectively with first and second longitudinal direction ends of said lateral wiring means.

6. A multilayer substrate as claimed in claim 4, wherein said wiring material extending in said lateral direction has a thickness identical to a thickness of said second insulating layer.

7. A multilayer substrate as claimed in claim 5, wherein said wiring material extending in said lateral direction has a thickness identical to a thickness of said second insulating layer.

8. A multilayer substrate as claimed in claim 4, wherein said conductive material of said lateral wiring means extending in said lateral direction comprises a metallic wiring material and said wiring material further includes an insulating material being a same insulating material as an insulating material which forms said second insulating layer.

9. A multilayer substrate as claimed in claim 6, wherein said conductive material of said wiring material extending in said lateral direction comprises a metallic wiring material, and said lateral wiring means further includes an insulating material being a same insulating material as an insulating material which forms said second insulating layer.

10. A multilayer substrate as claimed in claim 8, wherein said metallic wiring material contains 0.1% to 30% of said insulating material.

11. A multilayer substrate as claimed in any one of claims 8, 9 or 10, wherein said first and second insulating layers comprise alumina.

12. A multilayer substrate as claimed in claim 11, wherein said metallic wiring material of said lateral wiring means comprises a high melting metal selected from one of tungsten and molybdenum.

13. A multilayer substrate as claimed in claim 12, wherein said metallic wiring material additionally comprises a low melting metal selected from at least one of Ag, Au, Cu, Ni and Pd.

14. A multilayer substrate as claimed in claim 13, wherein said low melting metals are added in an amount of from 0.1% to 30%.

15. A multilayer substrate comprising:

a first insulating layer having a first through hole;

a second insulating layer having a second through hole;

said first and second through holes forming vertical current paths;

a third insulating layer between said first and second insulating layers and having a trench therein extending in a lateral direction of said multilayer substrate;

wiring material, formed by a conductive material filled into said trench, for electrically connecting said first through hole to said second through hole.

16. A multilayer substrate as claimed in claim 15, wherein said lateral wiring means has a thickness identical to a thickness of said third insulating layer.

17. A multilayer substrate comprising:

a plurality of insulating layers having a plurality of through holes which form vertical current paths, one of said plurality of insulating layers having a trench therein extending in a lateral direction of said multilayer substrate;

wiring material, formed by a conductive material filled in said trench, for forming a lateral current path; and first and second electric circuit means for electrically connecting said vertical and lateral current paths.

18. A multilayer substrate as claimed in claim 17, wherein said wiring material has a thickness identical to a thickness of said one of said plurality of insulating layers.

19. A multilayer substrate as claimed in claim 17, wherein said first and second electric circuit means are mounted on a top layer of said plurality of insulating layers.

20. A multilayer substrate as claimed in claim 19, wherein said one of said plurality of insulating layers, which has said trench filled with said conductive material forming said wiring material, is said top layer of said plurality of insulating layers.

21. A multilayer substrate as claimed in claim 20, wherein at least one of said first and second electric circuit means is mounted above said wiring material and electrically connects said one of said first and second electric circuit means to said wiring material directly.

22. A multilayer substrate as claimed in claim 21, wherein said conductive material of said wiring material comprises a metal selected from one of tungsten and molybdenum.

23. A multilayer substrate as claimed in claim 22, further comprising a plated layer formed on at least a region between said lateral wiring means and said one of said first and second electric circuit means.

24. A multilayer substrate comprising:

a substrate having a surface for installing a circuit element thereon, said substrate comprising a plurality of insulating layers which are laminated mutually, each of said plurality of insulating layers having a respective thickness; and an inner wiring, for forming a current path for said circuit element, disposed in said substrate and providing at least a lateral section for said inner wiring, said lateral section of said inner wiring extending in a lateral direction of said multilayer substrate parallel to said substrate surface and having a thickness substantially identical to said respective thickness of at least one of said plurality of insulating layers, said inner wiring having a sheet resistance of no more than about 1 m$\Omega$/□.

25. A multilayer substrate according to claim 24, wherein said lateral section of said inner wiring comprises a main metal material selected from one of tungsten and molybdenum.

26. A multilayer substrate according to claim 25, wherein:

said one of said plurality of insulating layers comprises alumina; and said lateral section of said inner wiring contains 0.1% to 30% of alumina.

27. A multilayer substrate according to claim 26, wherein said lateral section of said inner wiring comprises an auxiliary metal having a first melting point lower than a second melting point of said main metal.

28. A multilayer substrate according to claim 27, wherein said auxiliary metal is selected from a group consisting of Ag, Au, Cu, Ni and Pd.

29. A multilayer substrate according to claim 28, wherein said auxiliary metal is added in an amount of from 0.1% to 30%.

30. A multilayer substrate according to claim 24, wherein said lateral section of said inner wiring is located at said surface of said multilayer substrate and said circuit element is installed on said lateral section of said inner wiring directly.

31. A multilayer substrate according to claim 30, further comprising a plated layer formed at least on an interface between said lateral section of said inner wiring and said circuit element.

* * * * *